US008981279B2

(12) United States Patent
Lin

(10) Patent No.: US 8,981,279 B2
(45) Date of Patent: Mar. 17, 2015

(54) PHOTOELECTRIC CONVERTER CAPABLE OF EMITTING STABLE OPTICAL SIGNAL

(75) Inventor: I-Thun Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 319 days.

(21) Appl. No.: 13/473,811

(22) Filed: May 17, 2012

(65) Prior Publication Data

US 2013/0146746 A1    Jun. 13, 2013

(30) Foreign Application Priority Data

Dec. 13, 2011    (TW) .............................. 100145938

(51) Int. Cl.
*H01J 3/14*    (2006.01)
*G02B 6/42*    (2006.01)
*H01L 31/0232*    (2014.01)

(52) U.S. Cl.
CPC ........ *H01L 31/02327* (2013.01); *G02B 6/4214* (2013.01); *G02B 6/4246* (2013.01); *G02B 6/4286* (2013.01)
USPC ....................................................... 250/216

(58) Field of Classification Search
USPC ............. 250/216; 372/9, 29.014; 369/112.28, 369/112.09
See application file for complete search history.

(56) References Cited

U.S. PATENT DOCUMENTS 6,061,371 A  *  5/2000  Uejima et al. ................... 372/31
RE40,414 E  *  7/2008  Takahashi et al. ....... 369/112.02
7,439,533 B2 *  10/2008  Kito et al. ...................... 250/552

* cited by examiner

*Primary Examiner* — Thanh Luu
(74) *Attorney, Agent, or Firm* — Novak Druce Connolly Bove + Quigg LLP

(57) ABSTRACT

A photoelectric converter includes a circuit board, a laser diode electrical mounted on the circuit board, a supporting frame, an optical transmission member mounted on the supporting frame, a beam splitting assembly and an optical sensor positioned beside the beam splitting assembly. The laser diode, the beam splitting assembly and the optical sensor are received in a space cooperatively defined by the supporting frame and the optical transmission member. The laser diode emits optical signals. A part of optical signals is refracted by the beam splitter and transmitted to the optical transmission member, and the other part of optical signals is reflected by the beam splitter to the optical sensor.

14 Claims, 4 Drawing Sheets

PHOTOELECTRIC CONVERTER CAPABLE OF EMITTING STABLE OPTICAL SIGNAL

BACKGROUND

1. Technical Field

The present disclosure relates generally to photoelectric conversion, especially to a photoelectric converter.

2. Description of Related Art

A photoelectric converter may include a laser diode for emitting optical signals, a first optical transmission assembly, a second optical transmission assembly coupled with the first optical transmission assembly, and a photo diode. The optical signals emitted from the laser diode can enter the first optical transmission assembly, and be transmitted through the second optical transmission assembly to the photo diode, and be finally converted into electrical signals by the photo diode.

The performance of the signal transmission system of the photoelectric converter may be monitored by an eye diagram. However, when the bandwidth of the optical signals is wide, or in other words, when the laser diode emits optical signals of both high and low energy, the time domain distribution of the eye diagram is resulting to being unstable. Thus users may fail to obtain the performance of the signal transmission system of the photoelectric converter from the eye diagram.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
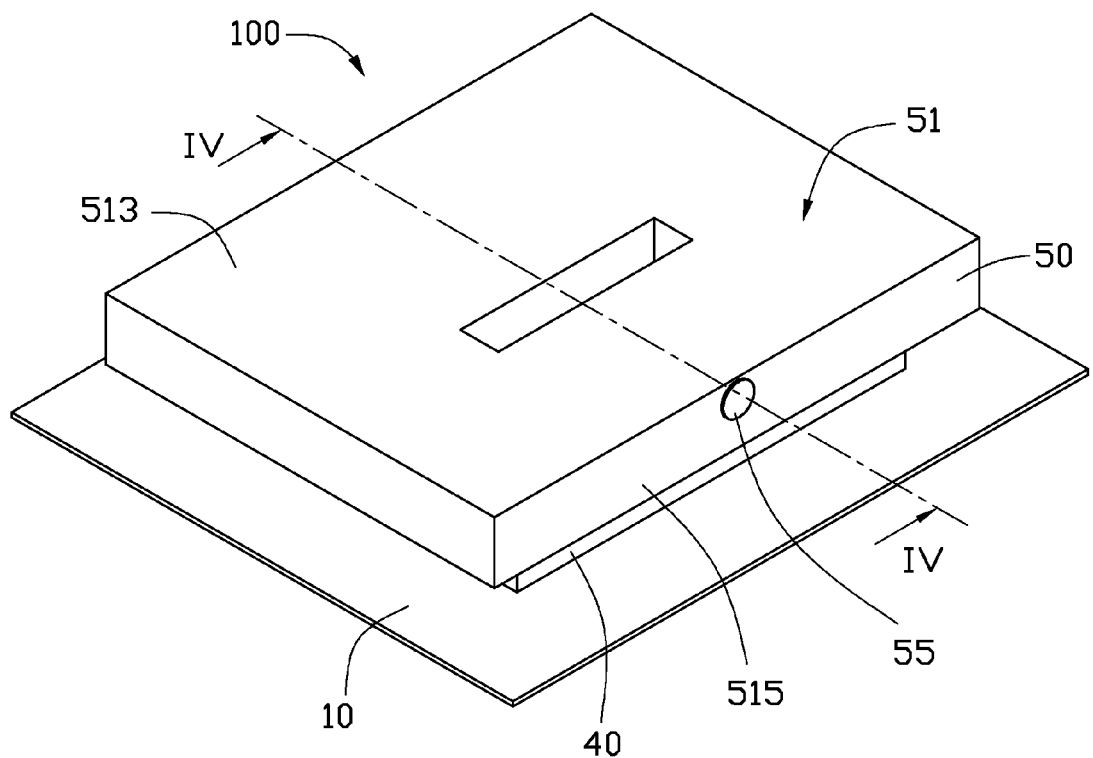
FIG. 1 is an isometric view of one embodiment of a photoelectrical converter.
Figure 2:
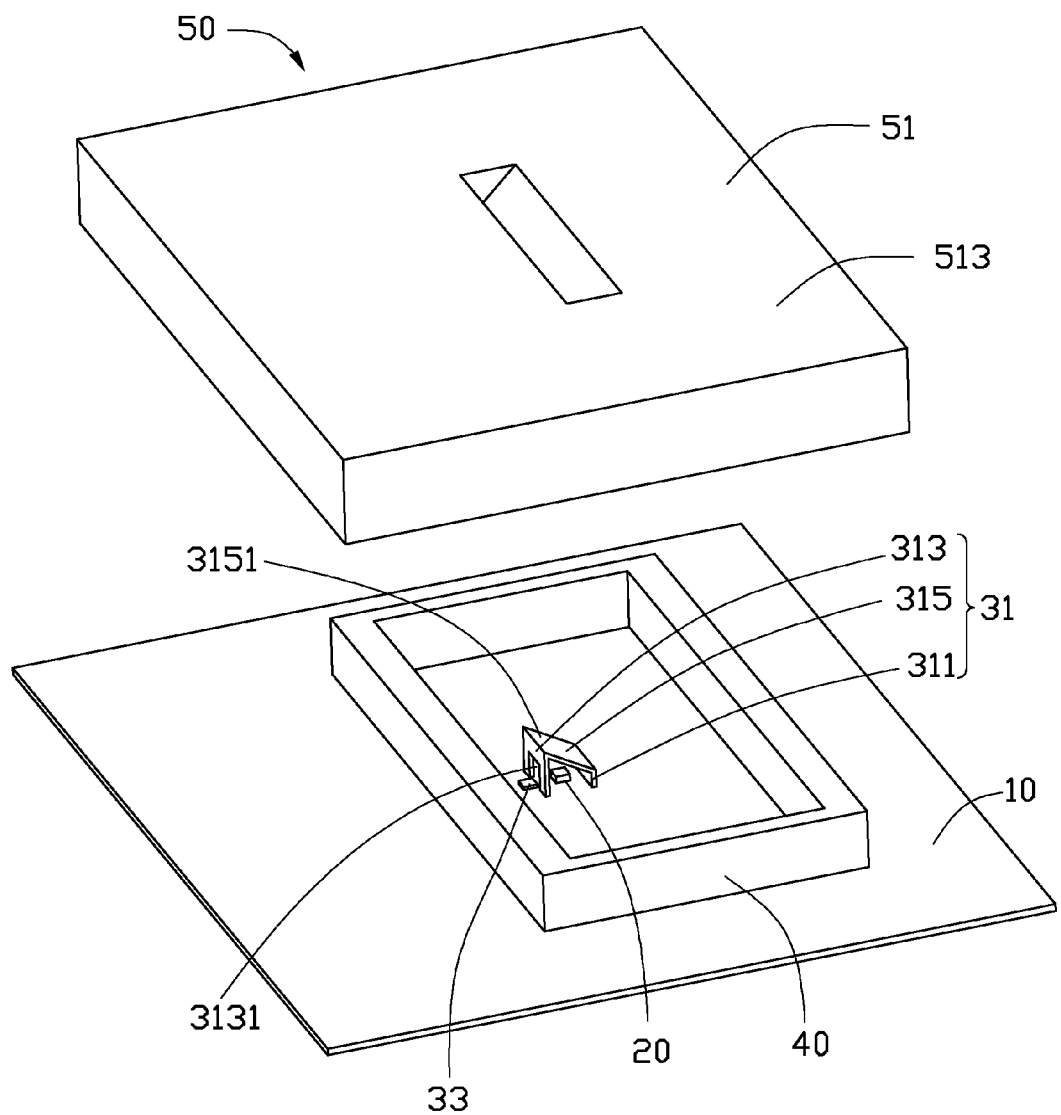
FIG. 2 is an exploded, isometric view of the photoelectrical converter shown in FIG. 1.

FIGS. 1 and 2 show one embodiment of a photoelectric converter 100 including a circuit board 10, a laser diode 20, a beam splitting assembly 31, an optical sensor 33, a supporting frame 40, and an optical transmission member 50. The laser diode 20, the beam splitting assembly 31, the optical sensor 33, and the supporting frame 40 are mounted on the circuit board 10. The laser diode 20 and the optical sensor 33 are electrically connected to the circuit board 10. The supporting frame 40 is fixed on the circuit board 10, and surrounds the laser diode 20, the beam splitting assembly 31, and the optical sensor 33. The optical transmission member 50 is mounted on the supporting frame 40 at one side away from the circuit board 10, and opposite to the laser diode 20 and the beam splitting assembly 31. The laser diode 20, the beam splitting assembly 31, and the optical sensor 33 are received in a space cooperatively defined by the supporting frame 40, the circuit board 10, and the optical transmission member 50. The photoelectric converter 100 transmits and converts a plurality of optical signals into a plurality of digital electrical signals The photoelectric converter 100 further includes a plurality of functional modules (not shown) and other components (not shown), but, for simplicity, the functional modules and other components are not described herein.

Figure 4:
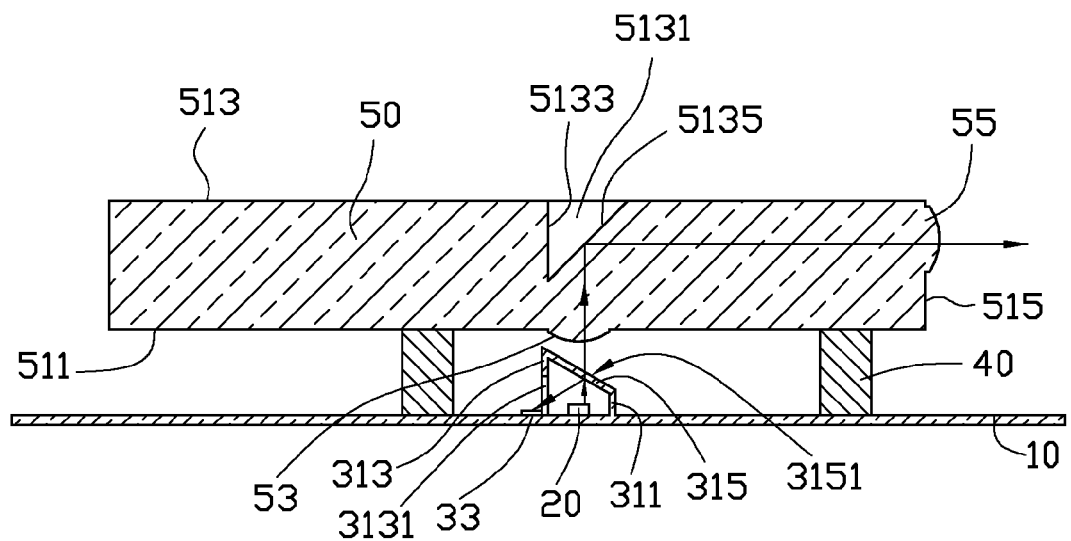
FIG. 4 is a sectional view of the photoelectrical converter shown in FIG. 1 taken along line IV-IV.

FIGS. 2 and 4 show the beam splitting assembly 31 and the optical sensor 33 mounted on the circuit board 10. The beam splitting assembly 31 is disposed above the laser diode 20 and covering the laser diode 20. The optical sensor 33 is positioned adjacent to the beam splitting assembly 31 and the laser diode 20.

The beam splitting assembly 31 includes a first supporting portion 311, a second supporting portion 313, and a beam splitter 315. The first supporting portion 311, the second supporting portion 313, and the beam splitter 315 are substantially a plurality of thin sheets. The first supporting portion 311 and the second supporting portion 313 are substantially perpendicular to the circuit board 10, and are located at opposite sides of the laser diode 20. The beam splitter 315 connects the top end of the first supporting portion 311 with the top end of the second supporting portion 313. A height of the first supporting portion 311 is less than that of the second supporting portion 313, which results in the beam splitter 315 being inclined relative to the circuit board 10.

The second supporting portion 313 defines an opening hole 3131 at an end thereof adjacent to the circuit board 10, for the optical signals reflected by the beam splitter 315 to pass through. In the illustrated embodiment, the opening hole 3131 is substantially rectangular. In other embodiments, the opening hole 3131 may be other shapes, such as circular, or trapezoidal for example. The optical sensor 33 is positioned at a side of the second supporting portion 313 away from the first supporting portion 311, and the optical sensor 33 is adjacent to the opening hole 3131.

The beam splitter 315 forms a semi-reflective film 3151 at a sidewall thereof away from the circuit board 10. The semi-reflective film 3151 can be formed via an electron-beam evaporation process, plasma enhanced chemical vapor deposition, or by magnetron sputtering, for example. In the illustrated embodiment, the semi-reflective film 3151 is formed via an electron-beam evaporation process.

The laser diode 20 is positioned between the first supporting portion 311 and the second supporting portion 313, and is horizontally aligned with the optical sensor 33, and is positioned opposite to the beam splitter 315. The laser diode 20 emits a plurality of optical signals, and the optical signals can reach the beam splitter 315. Since there is a semi-reflective film 3151 formed on the sidewall of the beam splitter 315, the greater part of the optical signals emitted from the laser diode 20 is refracted by the beam splitter 315 to the optical transmission member 50, and the other lesser part of optical signals emitted from the laser diode 20 is reflected by the beam splitter 315 to the optical sensor 33 passing through the opening hole 3131.

The supporting frame 40 is substantially a rectangular frame. In another embodiment, the supporting frame 40, surrounding the laser diode 20 and the beam splitting assembly 31 and the optical sensor 33, can be other shapes, such as circular or trapezoidal for example.

Figure 3:
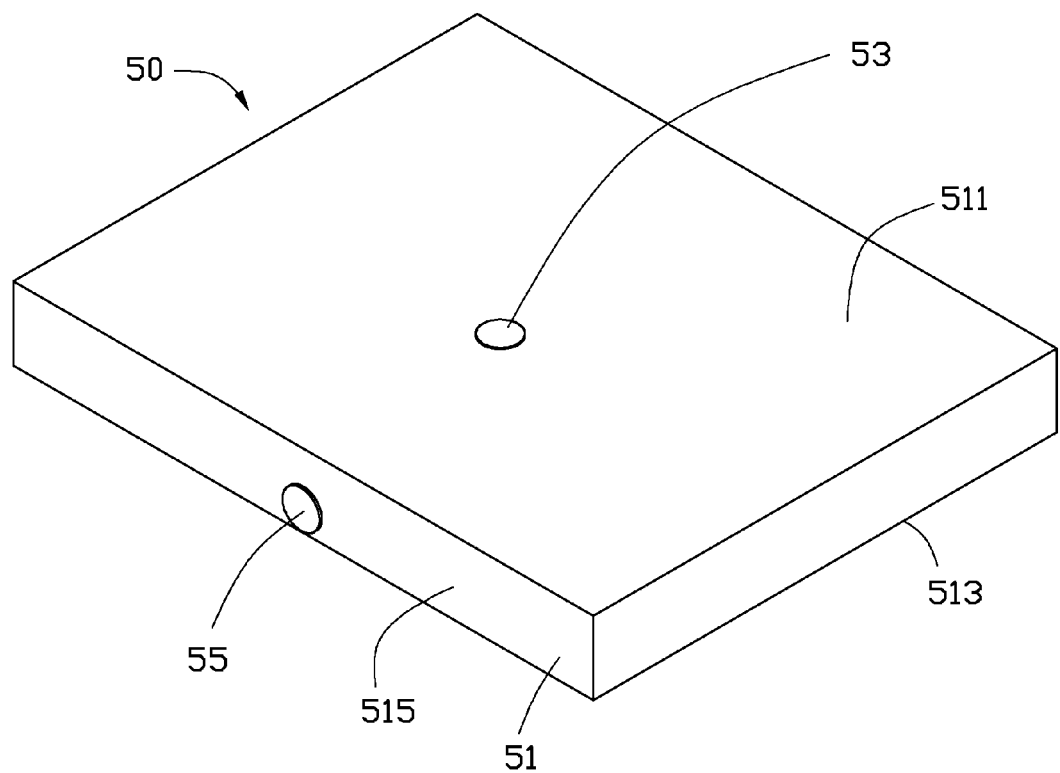
FIG. 3 is similar to FIG. 2, but viewed from another aspect.

FIG. 3 shows an optical transmission member 50 mounted on the top of the supporting frame 40. The optical transmission member 50 includes a main body 51, a first lens 53, and a second lens 55. In the illustrated embodiment, the first lens 53 and the second lens 55 are a plurality of convex spherical lenses. The main body 51 is made of an optical medium material, such as an optical crystal, an optical plastic, or an optical glass, for example.

The main body 51 is substantially rectangular, and includes a first surface 511 towards the beam splitter 315, a second surface 513 opposite to the first supporting frame 40, and a sidewall 515 connecting the first surface 511 and the second surface 513, respectively. In the illustrated embodiment, the sidewall 515 is perpendicular to the first surface 511 and the second surface 513.

FIG. 4 shows the second surface 513 defining a groove 5131. In the illustrated embodiment, the groove 5131 is substantially triangular, and includes a first sidewall 5133, and a second sidewall 5135 intersecting with the first sidewall 5133. The first sidewall 5133 is perpendicular to the circuit board 10. The second sidewall 5135 intersects with the first sidewall 5131 at an angle of 45 degrees.

The first lens 53 is mounted on the first surface 511, and aligned with the beam splitter 315 and the groove 5131. The second lens 55 is mounted on the sidewall 515, and the second lens 55 is horizontally aligned with the second sidewall 5135. The first lens 53 and the second lens 55 are positioned in the same plane perpendicular to the circuit board 10.

In another embodiment, the sidewall 515 can intersect with the first surface 511 and the second surface 513. The included angle between the sidewall 515 and the first surface 511 is preset to allow the optical signals reaching the surface of the second sidewall 5135 from the first lens 53 to be totally reflected onto the second lens 55, and the included angle between the first surface 511 and the second surface 513 is adjusted accordingly. The main body 51 can be made of material of a high index of refractivity to make the second sidewall 5135 to totally reflect the optical signals.

In use, the laser diode 20 emits the optical signals, and the optical signals reach the beam splitter 315. The part of the optical signals which are refracted by the beam splitter 315 are collected by the first lens 53, and the collected optical signals are transmitted to the second sidewall 5135 via the main body 51. The second sidewall 5135 totally reflects the optical signals onto the second lens 55 parallel to the circuit board 10 through the main body 51. The second lens 55 collimates the optical signals and transmits the optical signals to the functional modules to achieve the conversion from optical signals to electrical signals. The remaining part of the optical signals emitted from the laser diode 20 is reflected by the beam splitter 315 onto the optical sensor 33 passing through the opening hole 3131.

The optical sensor 33 senses the optical signals and feeds back an electrical signal to the circuit board 10 because a part of optical signals emitted from the laser diode 20 are refracted by the beam splitter 315 to the optical transmission member 50, and the other part of optical signals are reflected by the beam splitter 315 to the optical sensor 33. In this way, the circuit board 10 controls the laser diode 20 to emit the optical signals in a stable time domain distribution. Thus the eye diagram of the photoelectric converter 100 is distinguishable.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A photoelectric converter, comprising:
   a circuit board;
   a laser diode electrically connected to the circuit board;
   a beam splitting assembly covering the laser diode, and comprising a first supporting portion, a second supporting portion, and an beam splitter, the first supporting portion and the second supporting portion being perpendicularly mounted on the circuit board, the second supporting portion defining an opening hole at an end thereof adjacent to the circuit board, the beam splitter interconnecting the top end of the first supporting portion and the top end of the second supporting portion, and a height of the first supporting portion being less than that of the second supporting portion;
   an optical sensor electrically mounted on the circuit board, and located beside the opening hole;
   a supporting frame mounted on the circuit board to surround the laser diode, the beam splitting assembly, and the optical sensor; and
   an optical transmission member mounted on the supporting frame opposite to the beam splitting assembly,
   wherein the laser diode emits one or more optical signals, and a part of optical signals are refracted by the beam splitting assembly to the optical transmission member, and the other part of optical signals are reflected by the beam splitting assembly to the optical sensor.

2. The photoelectric converter of claim 1, wherein the beam splitter forms a semi-reflective film at a sidewall thereof away from the circuit board.

3. The photoelectric converter of claim 1, wherein the laser diode is located between the first supporting portion and the second supporting portion, and the laser diode is opposite to the beam splitter.

4. The photoelectric converter of claim 3, wherein the optical transmission member comprises a main body, a first lens and a second lens; the main body is mounted on the supporting frame; the main body comprises a first surface towards the beam splitting assembly, a second surface opposite to the supporting frame, and a sidewall connecting the first surface and the second surface; the first lens is mounted on the first surface, and is aligned with the beam splitting assembly; the second lens is mounted on the sidewall.

5. The photoelectric converter of claim 4, wherein the first lens and the second lens are a plurality of convex spherical lenses.

6. The photoelectric converter of claim 4, wherein the main body defines a groove at the second surface; the groove comprises a first sidewall, and a second sidewall intersecting with the first sidewall; the first sidewall is perpendicular to the circuit board.

7. The photoelectric converter of claim 6, wherein the second sidewall intersects with the first sidewall at 45 degrees.

8. A photoelectric converter, comprising:
   a circuit board
   a beam splitting assembly comprising a first supporting portion, a second supporting portion, and an beam splitter, the first supporting portion and the second supporting portion being perpendicularly mounted on the circuit board, the second supporting portion defining an opening hole at an end thereof adjacent to the circuit board, the beam splitter interconnecting the top end of the first supporting portion and the top end of the second supporting portion, and a height of the first supporting portion being less than that of the second supporting portion;
   an optical sensor electrically mounted on the circuit board, and located beside the opening hole;
   a laser diode electrically connected to the circuit board, and received below the beam splitting assembly;
   an optical transmission member positioned above the beam splitting assembly,
   wherein the laser diode emits a plurality of optical signals, and a part of the optical signals are refracted by the beam splitting assembly to the optical transmission member, and the other part of the optical signals are reflected by the beam splitting assembly to the optical sensor.

9. The photoelectric converter of claim 8, wherein the beam splitter forms a semi-reflective film at a sidewall thereof away from the circuit board.

10. The photoelectric converter of claim 8, wherein the laser diode is located between the first supporting portion and the second supporting portion, and the laser diode is opposite to the beam splitter.

11. The photoelectric converter of claim 10 further comprises a support frame mounted on the circuit board, wherein the optical transmission member comprises a main body, a first lens and a second lens; the main body is mounted on the supporting frame; the main body comprises a first surface towards the beam splitting assembly, a second surface opposite to the supporting frame, and a sidewall connecting the first surface and the second surface; the first lens is mounted on the first surface, and is aligned with the beam splitting assembly; the second lens is mounted on the sidewall.

12. The photoelectric converter of claim 11, wherein the first lens and the second lens are a plurality of convex spherical lenses.

13. The photoelectric converter of claim 11, wherein the main body defines a groove at the second surface; the groove comprises a first sidewall, and a second sidewall intersecting with the first sidewall; the first sidewall is perpendicular to the circuit board.

14. The photoelectric converter of claim 13, wherein the second sidewall intersects with the first sidewall at 45 degrees.

\* \* \* \* \*